June 23, 1970 W. B. GAUNT, JR 3,517,223

TRANSISTOR PHASE SHIFT CIRCUIT

Filed Nov. 17, 1967

INVENTOR
W. B. GAUNT JR.
BY J S Cubert
ATTORNEY

United States Patent Office 3,517,223

Patented June 23, 1970

3,517,223

TRANSISTOR PHASE SHIFT CIRCUIT

Wilmer B. Gaunt, Jr., Boxford, Mass., assignor to Bell Telephone Laboratories, Incorporated, Murray Hill and Berkeley Heights, N.J., a corporation of New York Filed Nov. 17, 1967, Ser. No. 683,949
Int. Cl. H03b 3/04
U.S. Cl. 307—295 9 Claims

ABSTRACT OF THE DISCLOSURE

A circuit having all-pass filter characteristics is described. The circuit includes a plurality of resistor-capacitor networks coupled between a pair of transistors, and a resistor coupled between the circuit input and the output transistor. A physically realizable transfer function is obtained having its complex plane pole-zero configuration symmetrical with the imaginary axis so that the absolute magnitude of the ratio of output signal to the input signal is constant for all input signal frequencies.

This invention is related to signal transmission arrangements, and, more particularly, to signal filtering circuits utilizing active devices.

This invention is related to signal transmission arrangements and, more particularly, to signal filtering circuits utilizing active devices.

In communication and related systems, it is often necessary to modify the characteristics of signals being transmitted therein. Filter circuits are generally employed to alter the amplitude or the phase characteristics of signals, or both, as a function of frequency. The circuits may be placed at appropriate points in a transmission path to compensate for the losses and the varying delay characteristics of the path. One type of filter circuit known as an all-pass filter is particularly useful if it is desired to modify only the phase characteristics of a signal after it has passed through some portion of a transmission path. In this type of filter, the transfer function relating the output signal to the input signal applied thereto has the same magnitude at all frequencies within the frequency band of interest. Because of this circuit characteristic, all-pass filters may act as phase equalizers to compensate for the varying delay properties of the transmission path where these properties are predetermined functions of frequency.

All-pass filters are also employed in quadrature modulation schemes in which it is necessary to produce two versions of a single input signal having identical amplitude characteristics as the input signal but phase characteristics that differ by 90° at each frequency within the frequency band of interest. This circuit function may be realized by passing the single input signal through two all-pass filters, the inputs of which are connected in parallel. The phase characteristics of one filter may be arranged so that the desired 90° difference in phase response is achieved. Because the amplitude properties of the signals from the all-pass filters are identical to the amplitude properties of the input signal, the circuit arrangement is particularly useful in single sideband modulation schemes wherein quadrature modulators and quadrature demodulators are required.

One type of priorly known all-pass filter arrangement comprises a cascaded array of lattice networks in which complex arrangements of passive elements are used. Such lattice networks generally require balanced inputs, i.e., signals consisting of two equal but oppositely phased components each being applied to a separate lead. Transformers may be used to develop the needed balanced signal, but each transformers complicate the design of the network and are practical only within a limited frequency range. Additionally, the design of the lattice network is complex and expensive and the desired all-pass filter characteristics may be physically realized only under special conditions.

Active devices have been utilized in all-pass filters to overcome the problems inherent in lattice networks used for this purpose. But many of these active device circuits include inductances which are difficult to construct and which significantly increase the overall circuit cost. Active device all-pass filter circuits employing only RC networks are known in the art, but these priorly known circuits generally provide a first order all-pass transfer function so that a complex array of such first order circuits are required to obtain higher order transfer characteristics.

BRIEF SUMMARY OF THE INVENTION

This invention is a signal transmission circuit in which an input signal is coupled through two separate paths and then recombined in an amplifying device so that the ratio of the amplitude of the output signal from the circuit to the input signal amplitude is invariant with frequency for all frequency components of the input signal. In accordance with an embodiment of this invention, the input signal is transmitted through a first amplifier and the inverted amplifier output is passed through a cascaded combination of resistance-capacitance networks to the input of a second amplifier. The input signal is separately coupled through an impedance to the second amplifier input. The second amplifier is so arranged that the signals coupled thereto are linearly combined in a low impedance at its input. The transfer function of the combined coupling paths is characterized by a pole-zero configuration in the complex plane representation which is symmetrical about the imaginary axis of the plane so that the absolute magnitude of the ratio of the signal at the second amplifier output to the input signal is constant.

DETAILED DESCRIPTION

Figure 1:
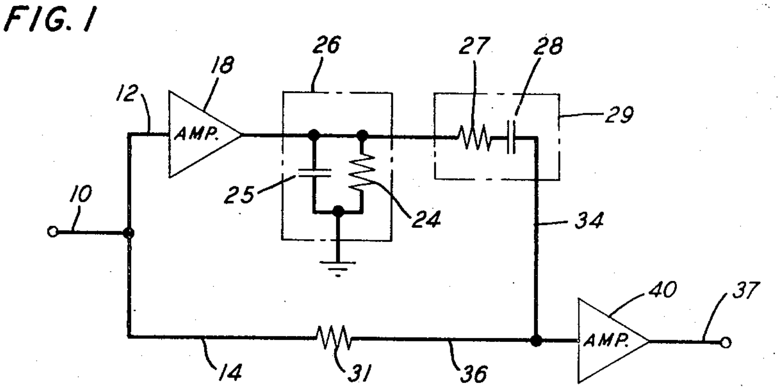
FIG. 1 depicts one specific illustrative embodiment of my invention.

FIG. 1 shows a signal transmission circuit in accordance with one embodiment of this invention. An input signal, which may include a plurality of frequency components, is applied to lead 10 and is coupled through amplifier 18, network 26, and network 29 to the input of amplifier 40. Amplifier 18 produces an output signal current that is inverted with respect to the applied input signal. The signal from lead 10 is also transmitted to the input of amplifier 40 through lead 14, impedance 31, and lead 36. The inverted signal modified by networks 26 and 29 and the signal transmitted through impedance 31 are linearly combined at the input of amplifier 40 and the output signal from amplifier 40 appearing on lead 37 is proportional to the linear signal combination.

Network 26 comprises parallel connected capacitor 25 and resistor 24, and network 29 comprises series connected resistor 27 and capacitor 28. This cascaded arrangement of networks alters the signal from amplifier 18 both in phase and amplitude. It is to be understood that other types of resistor-capacitor networks may be used to alter the signal from amplifier 18. Thus, networks 26 and 29 and impedance 31 can be arranged to provide various filter functions including the all-pass filter function by suitable selection of components in networks 26 and 29 in relation to impedance 31.

As is well known in the art, a circuit in which the absolute magnitude of the ratio of the output signal to the applied input signal is constant can be obtained when the transfer function relating the output signal to the input signal is of the form $$\frac{p^2-ap+b^2}{p^2+ap+b^2} \qquad (1)$$

In Equation 1, which describes a second order filter function, $p$ represents the complex frequency variable $j\omega$ and $a$ and $b$ are constants determined by the circuit components. The location of the poles and zeroes of the transfer function of Equation 1 is shown on FIG. 3. Since the networks of FIG. 1 comprise only resistor-capacitor combinations, all the poles and zeros are located on the real axis. This is in accordance with the well-known principles of network analysis. The poles and zeros of Equation 1 are always symmetrical with respect to the imaginary axis. This is true because the numerator and denominator of Equation 1 are identical except for the sign of the middle term. As indicated on FIG. 3, at any frequency $j\omega$, e.g., point 209, the product of vectors from the zeros of the transfer function, i.e., $b_1$ and $b_2$ located at points 203 and 207 divided by the product of the vectors from the poles of the transfer function, i.e., $a_1$ and $a_2$ located at points 201 and 205 is always constant. Thus, the absolute magnitude of the transfer function is constant and the desired all-pass characteristic is obtained. This is so because of the symmetrical location of corresponding vectors from $a_1$ and $b_1$ and the corresponding vectors from $a_2$ and $b_2$.

The operation of the circuit of FIG. 1 as an all-pass filter is described as follows. For purposes of description, it is assumed a signal voltage $v_s$ is applied to lead 10. It is further assumed that capacitor 25 has a value $C_1$, resistor 24 has a value $R_1$, capacitor 28 has a value $C_2$, resistor 27 has a value $R_2$, and impedance 31 has a value R. It is also assumed that amplifier 40 is so arranged that the input impedance thereto is substantially zero. Under these conditions, the current flowing in lead 34 through network 29 is $$i_2=\frac{i_A}{1+\frac{Z_2}{Z_1}} \qquad (2)$$

where $$Z_1=\frac{1}{pC_1+\frac{1}{R_1}} \text{ and } Z_2=R_2+\frac{1}{pC_2}$$

are the impedances of networks 26 and 29, respectively. Amplifier 18, as well known in the art, may be arranged so that the signal voltage $v_s$ causes a current $$i_A=\frac{v_s}{k}$$

to appear at its output. Therefore, $$\frac{i_2}{v_s}=\frac{1}{k\left(1+\frac{Z_2}{Z_1}\right)} \qquad (3)$$

where $k$ is a constant determined by the particular form of amplifier 18. Since the input impedance to amplifier 40 is substantially zero, the current $i_1$ flowing in lead 36 is $v_s/R$, and the transfer function relating the signal current at the input of amplifier 40 to the input signal voltage $v_s$ may be expressed as $$T=\left(\frac{i_1-i_2}{v_s}\right)=\frac{1}{R}-\frac{1}{k\left(1+\frac{Z_2}{Z_1}\right)}=\frac{k\left(1+\frac{Z_2}{Z_1}\right)-R}{kR\left(1+\frac{Z_2}{Z_1}\right)} \qquad (4)$$

The current through lead 34 is subtracted from the current through lead 36 because of the signal phase reversal in amplifier 18.

In terms of the circuit components of the networks of FIG. 1, the transfer function may be expressed as $$T=\frac{1}{R}\left[\frac{p^2+\left(\omega_1+\omega_2+\frac{1}{R_2C_1}-\frac{R}{kR_2C_1}\right)p+\omega_1\omega_2}{p^2+\left(\omega_1+\omega_2+\frac{1}{R_2C_1}\right)p+\omega_1\omega_2}\right] \qquad (5)$$

where $\omega_1$ is $1/R_1C_1$ and $\omega_2$ is $1/R_2C_2$. In order that the expression of Equation 5 be of the same form as the expression of Equation 1.

$$\omega_1+\omega_2+\frac{1}{R_2C_1}-\frac{R}{kR_2C_1}=-\left(\omega_1+\omega_2+\frac{1}{R_2C_1}\right) \qquad (6)$$

This requires that $$R=2k\left(\frac{R_2}{R_1}+\frac{C_1}{C_2}+1\right) \qquad (7)$$

Under the conditions of Equation 7, Equation 5 is of the same form as Equation 1 and the all-pass characteristics are obtained. Thus, by appropriate selection of the components of the coupling networks in FIG. 1, the characteristics illustrated in FIG. 3 may be obtained.

Figure 2:
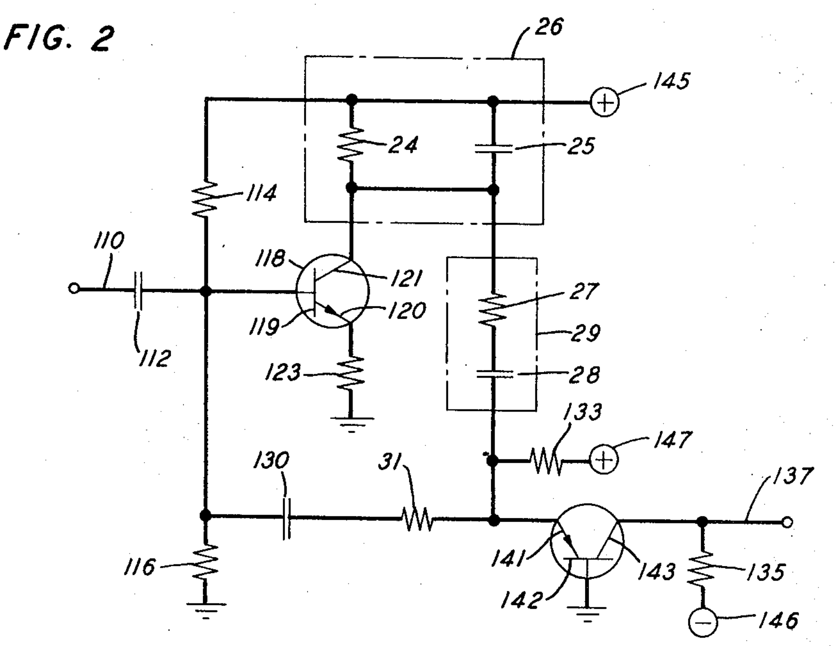
FIG. 2 depicts one specific illustrative implementation of the embodiment of FIG. 1 in which single transistor amplifiers are used.

FIG. 2 shows another embodiment of this invention in which NPN transistor 118 serves as amplifier 18 and PNP transistor 140 serves as amplifier 40. It is to be understood that the circuit of FIG. 2 may be modified to use PNP transistors or NPN transistors or another combination of PNP and NPN transistors. An input signal is applied to lead 110 and is coupled to base 119 of transistor 118 through capacitor 112. This capacitor prevents any D.C. component of the input signal from appearing at base 119. Positive voltage source 145 provides an appropriate D.C. supply voltage for the operation of transistor 118. Resistors 114 and 116 apply a bias current to base 119 so that transistor 118 operates in its linear mode.

The signal voltage at base 119 is coupled through the base-emitter path of transistor 118 to emitter 120 and appears across resistor 123. If a signal voltage $v_s$ is applied to base 119, the current in emitter 120 is $v_s/R_3$ where $R_3$ is the value of resistor 123. The current into collector 121 is substantially equal to this emitter current, in accordance with the well-known principles of transistor operation. The current from collector 121 is applied via network 26 and network 29 to emitter 141 of transistor 140. Transistor 118 and networks 26 and 29 provide one coupling path for the input signal.

The input signal from lead 110 is also applied through a second coupling path, including capacitor 130 and resistor 31, to emitter 141 of transistor 140. Capacitor 130 blocks any D.C. voltage appearing on base 119 from being transmitted to emitter 141. Resistor 31 determines the signal current flowing through the second coupling path to emitter 141. Where the value of resistor 31 is R, the signal current $i_1$ through resistor 31 is $v_s$/R. This is so because base 142 is returned to a ground reference voltage and the impedance seen at emitter 141 is low and may be substantially zero. The signal current $i_2$ through network 29 is described by Equation 2 where $i_A$ is $v_s/R_3$. The signal current applied to emitter 141 is $i_1$–$i_2$. Thus, the transfer function of Equation 5 applies to the circuit of FIG. 2 if $k$ is replaced by $R_3$.

Positive voltage source 147 supplies the bias current for emitter 141 through resistor 133, and negative voltage source 146 supplies the D.C. collector current for transistor 140 through resistor 135. Resistors 133 and 135 are selected to bias transistor 140 in its linear range.

Figure 3:
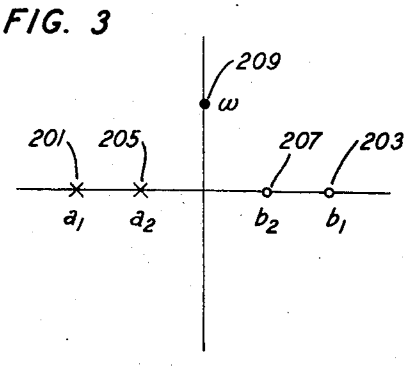
FIG. 3 shows a complex plane representation of the transfer function which may be obtained from the embodiments of FIG. 1 and FIG. 2.

The signal current, $i_1-i_2$, flowing into emitter 141 as determined by Equation 5 is substantially the same as the signal current flowing through collector 143 and resistor 135. The output signal appearing on lead 137 is, therefore, proportional to the signal current applied to emitter 141; and the desired all-pass characteristics illustrated in FIG. 3 are obtained in the circuit of FIG. 2.

The ratio of the amplitude of the output signals from leads 37 and 137 of FIGS. 1 and 2 to the amplitude of the input signals applied to leads 10 and 110, respectively, is constant for all frequency components of the input signal. Thus, the amplitude response is the same for all input frequencies. The phase characteristics of each of these circuits, however, can be varied by selecting the components of networks 26 and 29 and impedance 31 in accordance with Equations 5 and 7 so that a large range of phase responses may be obtained. In a cascaded arrangement of circuits, in accordance with the hereinbefore described embodiments of this invention, the phase response of each circuit can be arranged to provide several types of equalization characteristics. Each circuit provides a second-order all-pass transfer function according to Equation 5.

Figure 4:
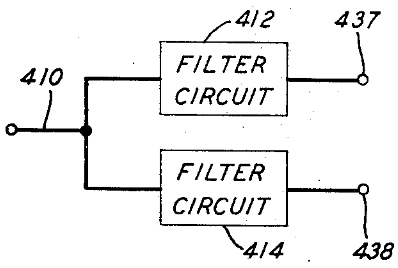
FIG. 4 illustrates how the embodiment of this invention may be applied to quadrature modulation schemes.

The phase characteristics of each circuit, in accordance with the above described embodiments of this invention, may be selected independently. Thus it is possible to provide a plurality of signals derived from a single input signal which signals have distinct phase characteristics in relation to each other. An example of such a scheme is shown in FIG. 4 where two filter circuits, 412 and 414, are supplied with a common input signal via lead 410. These circuits are identical to those described with respect to FIG. 1 and FIG. 2 except that the networks 26 and 29 are designed to provide different phase characteristics. Thus, the output signal appearing on lead 437 and on lead 438 may have identical amplitude characteristics as a function of frequency. The phase characteristics, however, may be made to vary by the selection of components for networks 26 and 29 and impedance 31. In a single sideband modulation scheme where it is necessary to provide quadraturely related signals having the same amplitude response characteristics, the circuit arrangement of FIG. 4 may be used to obtain the desired 90° difference in phase response.

The principles of this invention have been described with reference to the foregoing embodiments. Numerous other arrangements may be devised by those skilled in the art without departing from the spirit and scope of this invention.

I claim:

1. A signal transmission circuit comprising first and second amplifying means each having an input and an output terminal, means for applying a signal to said first amplifying means input terminal, means connected between said first amplifying means output terminal and said second amplifying means input terminal for coupling the amplified signal from said first amplifying means to said second amplifying means, and means connected between said signal applying means and said second amplifying means input terminal for directly coupling said signal to said second amplifying means, said amplified signal coupling means comprises a plurality of cascaded networks and said direct coupling means comprises impedance means, and said amplified signal coupling means and said direct coupling means being arranged so that the absolute magnitude of the ratio of the output signal appearing at said second amplifying means output terminal to said signal is the same at all input signal frequencies.

2. A signal transmission circuit according to claim 1 wherein said plurality of cascaded networks comprises a pair of networks, one of said pair of cascaded networks comprising a parallel-connected resistor and capacitor and the other of said cascaded networks comprising a series-connected resistor and capacitor.

3. A signal transmission circuit according to claim 1 wherein said second amplifying means comprises means for maintaining a low impedance at the input terminal of said second amplifying means.

4. A signal transmission circuit according to claim 3 wherein said first amplifying means comprises a first coupling device and said second amplifying means comprises a second coupling device, said first and second coupling devices each having input, output and control electrodes, said signal applying means being connected to said control electrode of said first coupling device, said amplified signal coupling means being connected between the output electrode of said first coupling device and the input electrode of said second coupling device, said second coupling device control electrode being connected to a ground reference voltage and wherein said output signal appears at the output electrode of said second coupling device.

5. In an all-pass filter, a circuit comprising input and output transistors each having a base, an emitter and a collector, means for applying a signal having a plurality of frequency components to the base of said input transistor, means connected between the collector of said input transistor and the emitter of said output transistor for coupling the signal from the collector of said input transistor to the emitter of said output transistor, said coupling means comprising a parallel-connected resistor and capacitor attached to the collector of said input transistor and a series-connected resistor and capacitor connected between said input transistor collector and the emitter of said output transistor, and impedance means including a resistor connected between said signal applying means and the emitter of said output transistor, whereby the ratio of the amplitude of the signal appearing at the collector of said output transistor to said signal amplitude at the signal applying means is the same for said signal frequency components.

6. In a signal transmission system, a plurality of circuits each comprising first and second coupling means having input, output and control electrodes, means for applying a signal to the control electrode of said first coupling means, third means connected between the output electrode of said first coupling means and the input electrode of said second coupling means for transmitting the signal appearing at the first coupling means output electrode to the second coupling means input electrode, and fourth means connected between said signal applying means and the second coupling means input electrode for directly transmitting said signal to the second coupling means input electrode, and means for applying a common signal to each circuit signal applying means, said third transmitting means in each of said circuits comprising a plurality of resistor-capacitor networks for producing a signal at the output electrode of the corresponding second coupling means having a distinct phase response to said common signal, the absolute magnitude of the ratio of each second coupling means output electrode signal to said common signal being constant and identical.

7. In a signal transmission system, a plurality of circuits according to claim 6 wherein said third means of each circuit comprises a distinct set of resistor-capacitor networks for producing a signal at said corresponding second coupling means output electrode having a phase response to said common signal different from the phase response of each of the other circuits.

8. In a signal transmission system, a plurality of circuits according to claim 7 wherein said plurality of circuits comprises a pair of circuits and said third means in each circuit comprises a plurality of resistor-capacitor networks for producing a signal at said corresponding second coupling means output electrode having a phase response to said common signal in quadrature with the phase response of the other of said pair of circuits.

9. A circuit having a constant-magnitude signal transfer function that is invariant with frequency comprising first and second amplifiers and means for applying a signal to the input of said first amplifier, characterized in that a plurality of resistor-capacitor networks are connected between the first and second amplifiers to couple the amplified signal from said first amplifier output to said second amplifier input and resistive means are connected between said signal applying means and said second amplifier input to directly transmit said signal to said second amplifier input whereby the pole-zero configuration in the complex plane representation of the transfer function is symmetrical with respect to the imaginary axis of the plane.

References Cited

UNITED STATES PATENTS

| | | | |
|---|---|---|---|
| 3,319,079 | 5/1967 | Matsumoto | 307—295 X |
| 3,322,970 | 5/1967 | Batteau | 307—295 |
| 3,336,540 | 8/1967 | Kwartiroff | 333—28 |
| 3,360,739 | 12/1967 | Cooke-Yarborough | 330—124 |
| 3,444,474 | 5/1969 | Borenstein et al. | 333—28 X |

DONALD D. FORRER, Primary Examiner

S. D. MILLER, Assistant Examiner

U.S. Cl. X.R.

307—232, 233; 328—155, 165; 330—9, 17, 20, 21, 151; 333—28